United States Patent
Setlur et al.

(10) Patent No.: US 6,685,852 B2
(45) Date of Patent: *Feb. 3, 2004

(54) PHOSPHOR BLENDS FOR GENERATING WHITE LIGHT FROM NEAR-UV/BLUE LIGHT-EMITTING DEVICES

(75) Inventors: Anant Achyut Setlur, Niskayuna, NY (US); Alok Mani Srivastava, Niskayuna, NY (US); Holly Ann Comanzo, Niskayuna, NY (US); Daniel Darcy Doxsee, Sagamore Hills, OH (US)

(73) Assignee: General Electric Company, Niskayuna, NY (US)

( * ) Notice: Subject to any disclaimer, the term of this patent is extended or adjusted under 35 U.S.C. 154(b) by 248 days.

This patent is subject to a terminal disclaimer.

(21) Appl. No.: 09/681,549

(22) Filed: Apr. 27, 2001

(65) Prior Publication Data

US 2002/0158565 A1 Oct. 31, 2002

(51) Int. Cl.⁷ .................. H01L 33/00; H01L 27/115; H01J 1/62
(52) U.S. Cl. .................. 252/301.4 R; 252/301.4 P; 313/503; 257/98
(58) Field of Search .................. 257/98; 313/503; 252/301.4 P, 301.4 R (56) References Cited

U.S. PATENT DOCUMENTS

| | | | |
|---|---|---|---|
| 5,777,350 A | 7/1998 | Nakamura et al. | 257/96 |
| 5,998,925 A | 12/1999 | Shimizu et al. | 313/503 |
| 6,066,861 A | 5/2000 | Hohn et al. | 257/99 |
| 6,252,254 B1 * | 6/2001 | Soules et al. | 257/89 |
| 6,501,100 B1 * | 12/2002 | Srivastava et al. | 257/79 |

* cited by examiner

Primary Examiner—C. Melissa Koslow
(74) Attorney, Agent, or Firm—Toan P. Vo; Patrick K. Patnode (57) ABSTRACT

Phosphor blends are disclosed that are capable of absorbing electromagnetic radiation having wavelengths in the range from about 315 nm to about 480 nm. These blends are mixtures of phosphors selected from the group consisting of $Sr_2P_2O_7:Eu^{2+}, Mn^{2+}$, $(Ca,Sr,Ba)_5(PO_4)_3(F,Cl,OH):Eu^{2+}, Mn^{2+}$, $3.5\ MgO \cdot 0.5MgF_2 \cdot GeO_2:Mn^{4+}$, $Sr_4Al_{14}O_{25}:Eu^{2+}$, $(Sr,Ba,Ca)_5(PO_4)_3(Cl,OH):Eu^{2+}$, $(Ba,Ca,Sr)_2MgAl_{16}O_{27}:Eu^{2+}$, and $(Ba,Ca,Sr)_2MgAl_{16}O_{27}:Eu^{2+},Mn^{2+}$. White light sources are obtained by applying a phosphor blend over at least one LED that is capable of emitting electromagnetic radiation in the above-noted wavelength range.

31 Claims, 12 Drawing Sheets

Table 1

| Example | Sr pyro-phosphate | $Ca(PO_4)_3Cl:Eu^{2+},Mn^{2+}$ | SAE | MFG | $BaMgAl_{16}O_{27}:Eu^{2+},Mn^{2+}$ | $Sr_5(PO_4)_3Cl:Eu^{2+}$ or $Ba_2MgAl_{16}O_{27}:Eu^{2+}$ | CT (K) | CRI | Luminosity (L/W$_{rad}$) | Distance from black body locus |
|---|---|---|---|---|---|---|---|---|---|---|
| 1 | 0.724 | 0 | 0 | 0 | 0.185 | 0.091 | 4100 | 73 | 355.13 | 0.03 |
| 2 | 0.798 | 0 | 0.045 | 0.014 | 0.113 | 0.030 | 3500 | 70 | 360.83 | 0.03 |
| 3 | 0.778 | 0 | 0 | 0.023 | 0.106 | 0.093 | 3500 | 70 | 343.06 | 0.003 |
| 4 | 0.678 | 0 | 0.065 | 0.099 | 0.086 | 0.072 | 3500 | 80 | 321.28 | 0.003 |
| 5 | 0.658 | 0 | 0.056 | 0.047 | 0.123 | 0.116 | 4100 | 80 | 322.84 | 0.003 |
| 6 | 0 | 0.706 | 0 | 0.044 | 0.180 | 0.071 | 4100 | 80 | 343.37 | 0.003 |
| 7 | 0 | 0.759 | 0 | 0 | 0.070 | 0.171 | 4100 | 75 | 354.83 | 0.003 |
| 8 | 0 | 0.763 | 0 | 0.001 | 0.220 | 0.016 | 4100 | 75 | 373.80 | 0.03 |
| 9 | 0 | 0.787 | 0 | 0.056 | 0.156 | 0 | 3500 | 75 | 359.21 | 0.01 |
| 10 | 0 | 0.732 | 0 | 0.100 | 0.168 | 0 | 3500 | 80 | 348.26 | 0.011 |
| 11 | 0.632 | 0 | 0.095 | 0.133 | 0.075 | 0.0645 | 3500 | 85 | 310.79 | 0.002 |
| 12 | 0 | 0.676 | 0 | 0.140 | 0.162 | 0.022 | 3500 | 85 | 330.80 | 0.002 |
| 13 | 0.613 | 0 | 0.089 | 0.083 | 0.102 | 0113 | 4100 | 85 | 312.04 | 0.002 |
| 14 | 0 | 0.654 | 0 | 0.086 | 0.186 | 0.074 | 4100 | 85 | 331.51 | 0.002 |
| 15 | 0.590 | 0 | 0.125 | 0.164 | 0.650 | 0.055 | 3500 | 90 | 301.47 | 0.002 |
| 16 | 0 | 0.628 | 0 | 0.178 | 0.170 | 0.0242 | 3500 | 90 | 320.47 | 0.002 |
| 17 | 0.570 | 0 | 0.122 | 0.117 | 0.090 | 0.101 | 4100 | 90 | 302.45 | 0.002 |
| 18 | 0 | 0.606 | 0 | 0.127 | 0.193 | 0.075 | 4100 | 90 | 320.98 | 0.002 |
| 19 | 0.530 | 0 | 0.15 | 0.150 | 0.080 | 0.090 | 4100 | 95 | 293.39 | 0.002 |
| 20 | 0 | 0.560 | 0 | 0.166 | 0.200 | 0.075 | 4100 | 95 | 310.84 | 0.002 |

PHOSPHOR BLENDS FOR GENERATING WHITE LIGHT FROM NEAR-UV/BLUE LIGHT-EMITTING DEVICES

CROSS REFERENCE TO RELATED APPLICATION

This patent application is related to application having ser. no. 09/681,686, titled "Yellow Light-Emitting Halophosphate Phosphors And Light Sources Incorporating the Same," filed on May 21, 2001.

FEDERAL RESEARCH STATEMENT

This invention was first conceived or reduced to practice in the performance of work under contract 70NANB8H4022 with the United States National Institute of Standards and Technology (NIST). The United States of America may have certain rights to this invention.

BACKGROUND OF INVENTION

This invention relates to blends of phosphors that convert electromagnetic radiation in the near-ultraviolet ("near-UV")-to-blue wavelength range to white light. More particularly, this invention relates to phosphor blends that convert electromagnetic radiation emitted by near-UV/blue light-emitting devices to white light. This invention also relates to light sources using such phosphor blends.

A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range. Well-known phosphors have been used in mercury vapor discharge lamps to convert the ultraviolet ("UV") radiation emitted by the excited mercury vapor to visible light. Other phosphors are capable of emitting visible light upon being excited by electrons (used in cathode ray tubes) or x rays (for example, scintillators in x-ray detection systems).

The efficiency of a lighting device that uses a phosphor increases as the difference between the wavelength of the exciting radiation and that of the emitted radiation narrows. Therefore, in the quest for improving efficiency of white light sources, effort has been dedicated to finding a source of stimulating radiation that has wavelengths longer than that of UV radiation and phosphors that respond to those wavelengths. Recent advances, in light-emitting diode ("LED") technology have brought efficient LEDs emitting in the near UV-to-blue range. The term "LEDs" as used herein also includes laser diodes. The term "near UV" as used herein means UV radiation having wavelengths in the range from about 315 nm to about 410 nm. These LEDs emitting radiation in the near UV-to-blue range will be hereinafter called "UV/blue LEDs." As used herein, a UV/blue LED may emit radiation having wavelengths in the near UV range, in the blue light range, or in a broad range from near UV to blue. It would be an advance to the technology of lighting to provide a range of phosphors that can be stimulated by the radiation emitted from these UV/blue LEDs radiation sources to allow for a flexibility in the use of phosphors for generating various color LEDs. Such phosphors when combined with the emission from the UV/blue LEDs can provide efficient and long lasting lighting devices that consume little power.

Many near UV/blue LEDs based on combinations of nitrides of indium, aluminum, and gallium have recently appeared. For example, U.S. Pat. No. 5,777,350 discloses LEDs comprising multiple layers of InGa and p- and n-type AlGaN, which emit in the wavelength range from about 380 nm to about 420 nm. Doping in the active layer of an LED can shift the peak emission from near UV to blue light wavelengths. A LED of the InGaN type emitting in the blue light wavelengths was combined with a coating of a yellow light-emitting yttrium aluminum garnet phosphor activated with cerium ("YAG:Ce") to produce white light and is disclosed in U.S. Pat. No. 5,998,925. Similarly, U.S. Pat. No. 6,066,861 discloses an yttrium aluminum garnet phosphor activated with terbium and/or cerium in which yttrium may be substituted with Ca and/or Sr, aluminum with Ga and/or Si, and oxygen with S, to be used as a component of a wavelength conversion layer for a blue light-emitting LED. YAG:Ce and its variations emit a broad-spectrum yellow light. Although a substantial portion of the need for white light devices may be filled by LED-based devices, the ability to combine a UV/blue LED with a phosphor has been limited because yttrium aluminum garnet phosphor and minor variations thereof have been the only known yellow light-emitting phosphors that are excitable by radiation in the blue range. This limitation has restricted, to some extent, the ability flexibly to design light sources having different color temperatures and achieving a high color rendering index ("CRI").

Therefore, there is a need to provide phosphor compositions that are excitable in the near UV-to-blue range and emit in the visible range such that they may be used flexibly to design light sources having tunable properties, such as color temperature and CRI.

SUMMARY OF INVENTION

The present invention provides phosphor blends that are excitable by electromagnetic radiation having wavelengths in the near UV-to-blue range (from about 315 nm to about 480 nm) to emit efficiently a visible light in a range of wavelengths from about 490 nm to about 770 nm. A phosphor blend of the present invention comprises a mixture of at least two phosphors selected from the group consisting of (a) $Sr_2P_2O_7:Eu^{2+},Mn^{2+}$ (hereinafter called "Sr pyrophosphate"); (b) $(Ca,Sr,Ba)_5(PO_4)_3(F,Cl,OH):Eu^{2+},Mn^{2+}$ (hereinafter called "Ca halophosphate"); (c) $3.5MgO.0.5MgF_2.GeO_2:Mn^{4+}$ (hereinafter called "MFG"); (d) $Sr_4Al_{14}O_{25}:Eu^{2+}$ (hereinafter called "SAE"); (e) $(Sr,Ba,Ca)_5(PO_4)_3(Cl,OH):Eu^{2+}$ (hereinafter called "SECA"); (f) an europium-activated aluminate phosphor selected from the group consisting of $(Ba,Ca,Sr)_2MgAl_{16}O_{27}:Eu^{2+}$, $(Ba,Ca,Sr)MgAl_{10}O_{17}:Eu^{2+}$, and $(Ba,Ca,Sr)Mg_3Al_{14}O_{25}:Eu^{2+}$ (hereinafter called "BAM"); and (g) an europium and manganese co-activated aluminate phosphor selected from the group consisting of $(Ba,Ca,Sr)_2MgAl_{16}O_{27}:Eu^{2+},Mn^{2+}$, $(Ba,Ca,Sr)MgAl_{10}O_{17}:Eu^{2+},Mn^{2+}$, and $(Ba,Ca,Sr)Mg_3Al_{14}O_{25}:Eu^{2+},Mn^{2+}$ (hereinafter called "BaMn"). By mixing appropriate proportions of these phosphors, composites of emission spectra may be created that provide a wide range of colors in the visible spectrum. Especially, white light sources having different color temperatures ("CT") and CRIs may be created from a combination of near UV-to-blue LEDs and phosphor blends of the present invention.

Other aspects, advantages, and salient features of the present invention will become apparent from a perusal of the following detailed description, which, when taken in conjunction with the accompanying figures, discloses embodiments of the present invention.

DETAILED DESCRIPTION

The present invention provides convenient phosphor blends that are excitable by electromagnetic radiation having wavelengths in the near UV-to-blue range (from about 315 nm to about 480 nm) to emit efficiently visible light in the wavelength range from about 490 nm to about 770 nm. The wavelength of the exciting radiation is preferably in the range from about 315 to about 420 nm, more preferably from about 350 nm to about 410 nm. A suitable near UV/blue LED for use with a phosphor blend of the present invention is one having an InGaN active layer as disclosed in U.S. Pat. No. 5,777,350. Particularly useful are those LEDs having a GaN layer or having only a very small amount of In dopant in the GaN layer as these LEDs would emit radiation predominantly in the wavelength range less than about 400 nm. The phosphor blends of the present invention comprise at least two phosphors selected from the group consisting of (a) $Sr_2P_2O_7:Eu^{2+},Mn^{2+}$; (b) $(Ca,Sr,Ba)_5(PO_4)_3(F,Cl,OH):Eu^{2+},Mn^{2+}$; (c) $3.5MgO\cdot0.5MgF_2\cdot GeO_2:Mn_{4+}$; (d) $Sr_4Al_{14}O_{25}:Eu^{2+}$; (e) $(Sr,Ba,Ca)_5(PO_4)_3(Cl,OH):Eu^{2+}$; (f) an europium-activated aluminate phosphor selected from the group consisting of $(Ba,Ca,Sr)_2MgAl_{16}O_{27}:Eu^{2+}$, $(Ba,Ca,Sr)MgAl_{10}O_{17}:Eu^{2+}$, and $(Ba,Ca,Sr)Mg_3Al_{14}O_{25}:Eu^{2+}$; and (g) an europium and manganese co-activated aluminate phosphor selected from the group consisting of $(Ba,Ca,Sr)_2MgAl_{16}O_{27}:Eu^{2+},Mn^{2+}$, $(Ba,Ca,Sr)MgAl_{10}O_{17:Eu}^{2+},Mn^{2+}$, and $(Ba,Ca,Sr)Mg_3Al_{14}O_{25}:Eu^{2+},Mn^{2+}$ (hereinafter called "BaMn"). In the formulas of the phosphors, the elements following the colons represent the activators or sensitizers and are present at low atomic proportions compared to the metals, such as less than about 20 percent. A group of elements separated by commas in a set of parentheses represent those elements that are interchangeable at the same lattice site.

Figure 9:
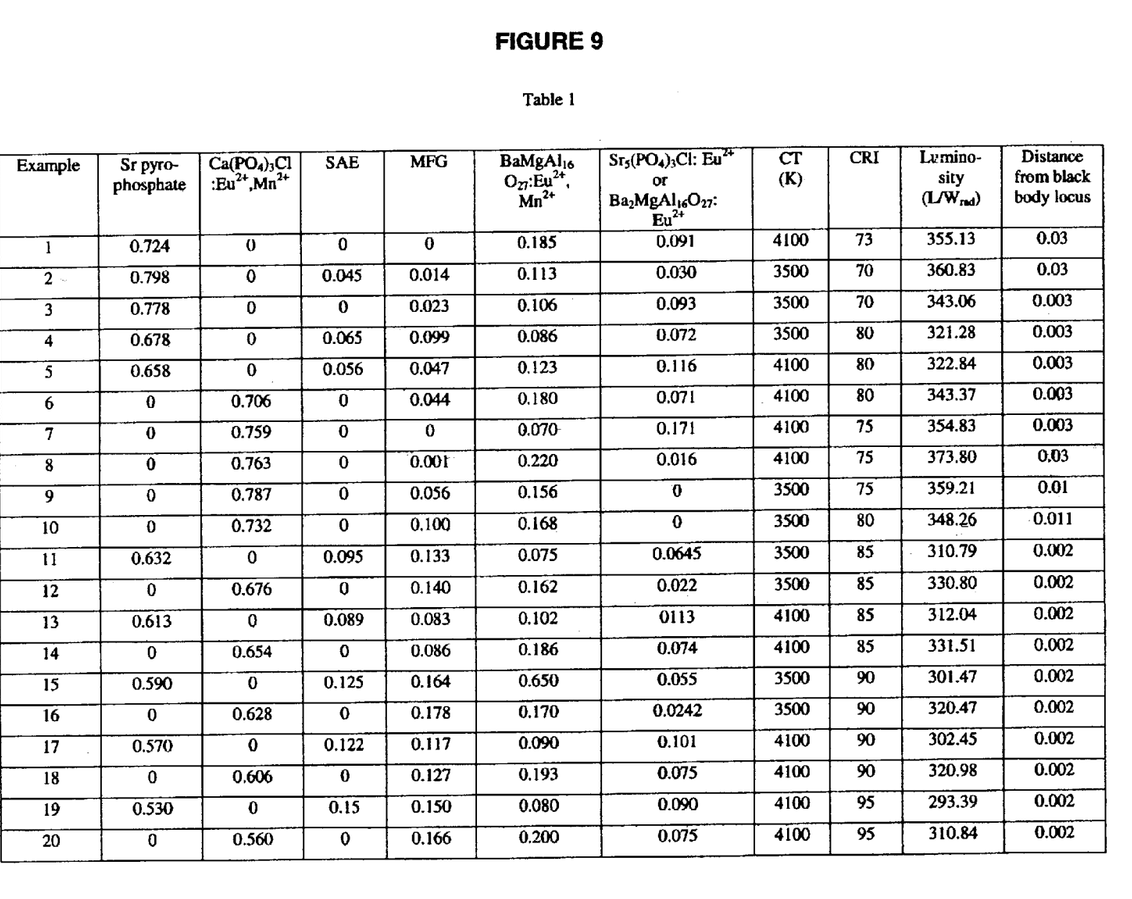
FIG. 9 shows a summary of the simulation results.

By mixing appropriate proportions of these phosphors, a composite emission spectrum of the blend may be created that provides a desired CT and CRI with maximum luminosity (as defined by the lumens per watt of radiation input energy or "$L/W_{rad}$"). CT of a light source is the temperature of a blackbody radiator that has the same color. An incandescent light bulb has a color temperature of about 2000 K. Between 3000 K and 5000 K, a light source appears intensely white. Sunlight has a color temperature of about 5000 K. As the color temperature increases to between 8000 K and 10000 K, the light source appears blue. The CRI of a test light source is a rating that represents the degree of resultant color shift of a test object under that test light source in comparison with its color under a standard lamp of the same temperature. When the CRI value is 100, the test object appears to have the same color as when it is illuminated by the standard light source. Compositions of phosphor blends may be chosen to provide emission of white light having coordinates close to the black body locus of the CIE chromaticity diagram. In general lighting applications, it is desirable to provide light sources having a color temperature in the range of 4000 K to 6000 K and a CRI of greater than 80. Table 1, which is shown in its entirety in FIG. 9, presents the result of a simulation of different blends of the phosphors. In this Table, the numerical value for each individual phosphor represents the proportion of the composite spectrum that the emission from the individual phosphor must contribute to result in the specified CT, CRI, luminosity, and distance from the black body locus; and it is not the weight fraction of the individual phosphor in the blend. The phosphor blend of this invention also is advantageously used with near-UV LEDs to produce less variation among the finished lamps.

Figure 1A:
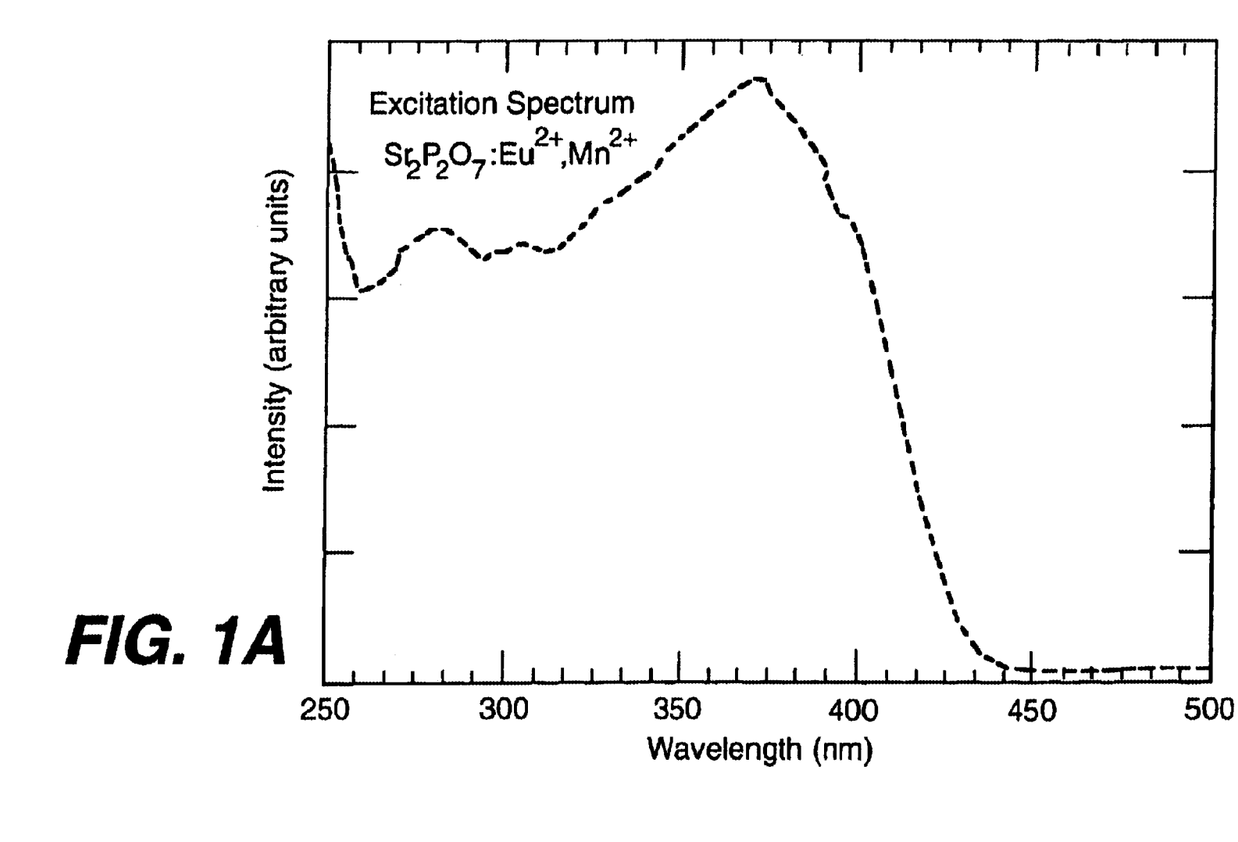
FIG. 1A shows the room-temperature excitation spectrum of the Sr pyrophosphate phosphor.
Figure 1B:
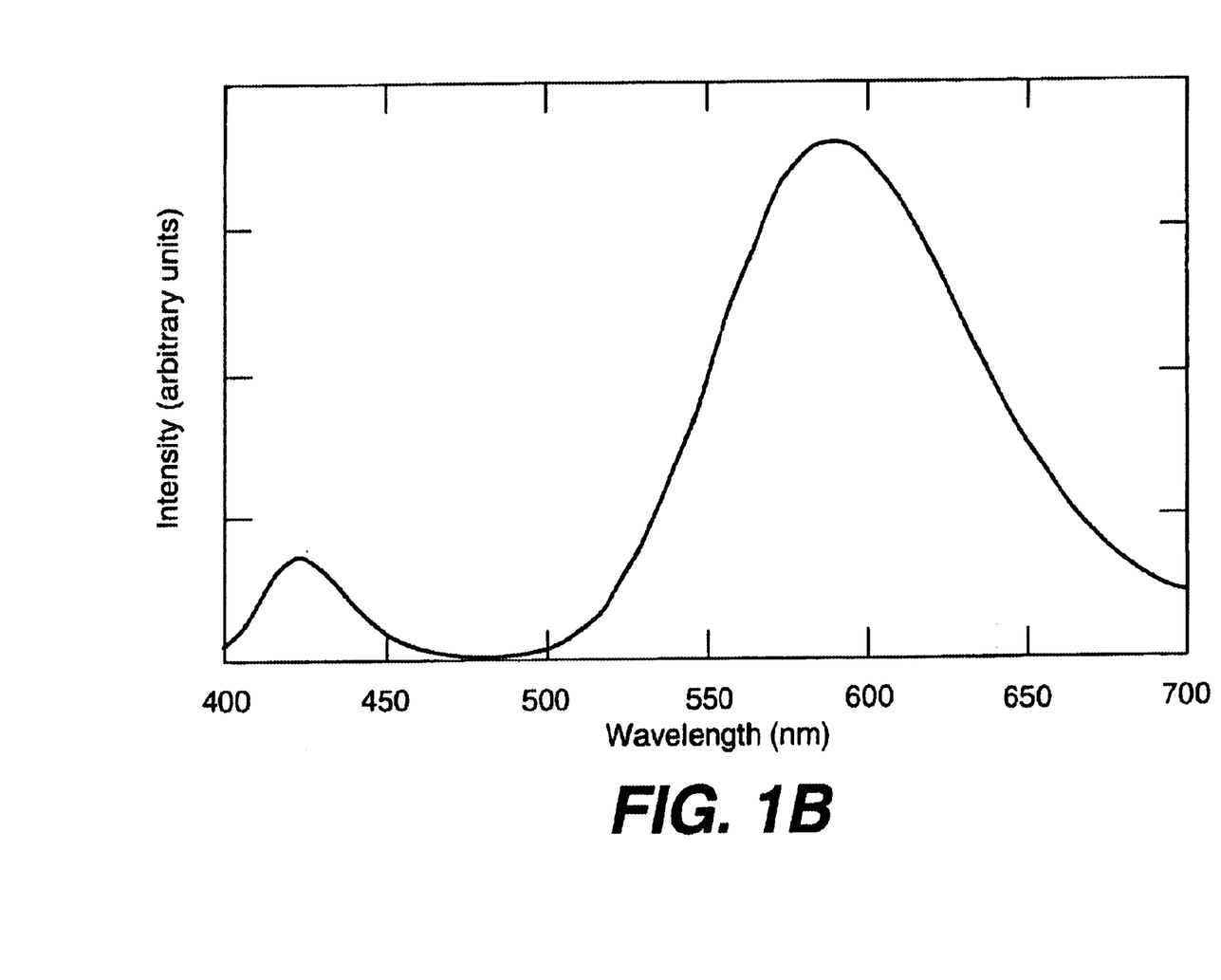
FIG. 1B shows the room-temperature emission spectrum of the Sr pyrophosphate phosphor.
Figure 2A:
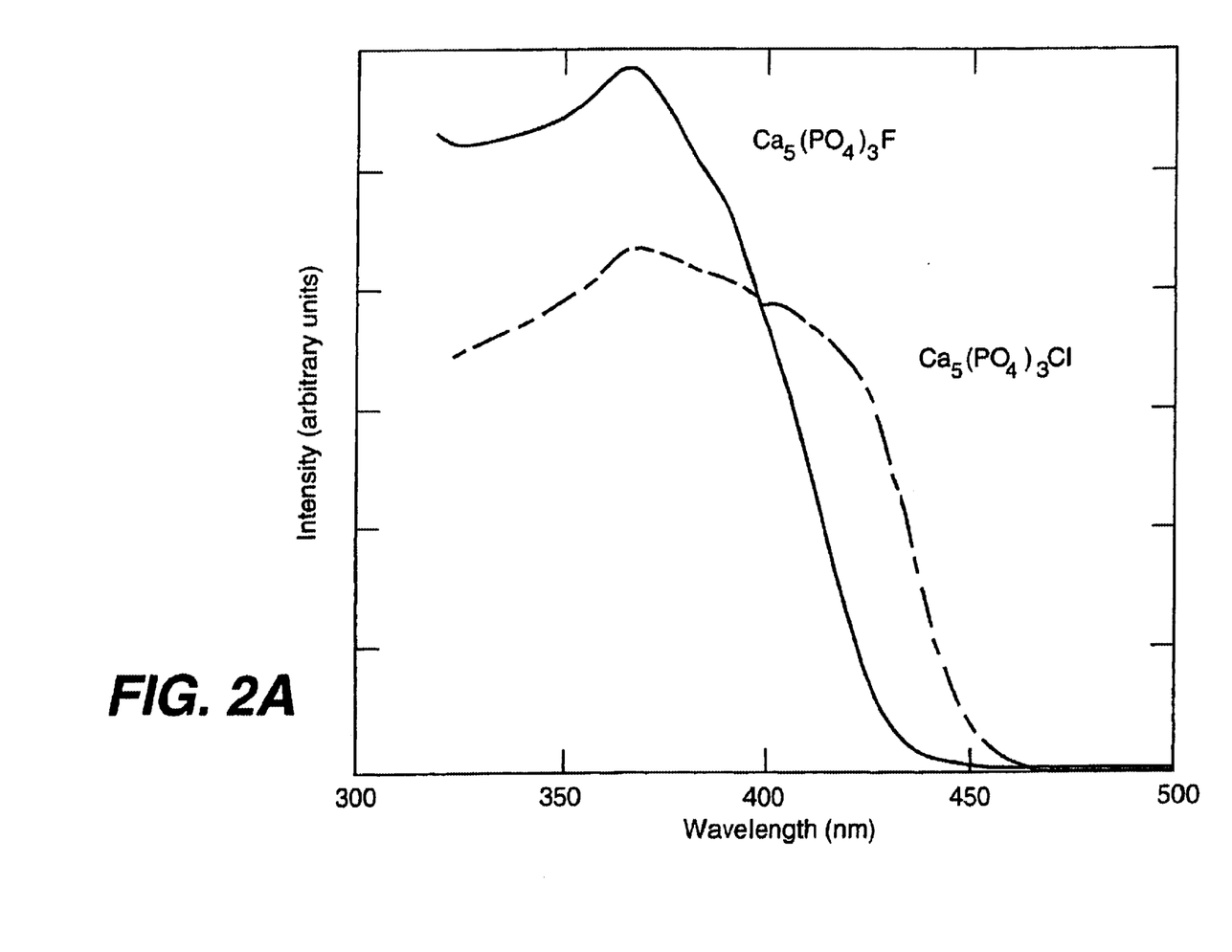
FIG. 2A shows the room-temperature excitation spectra of two calcium halophosphate phosphors.
Figure 2B:
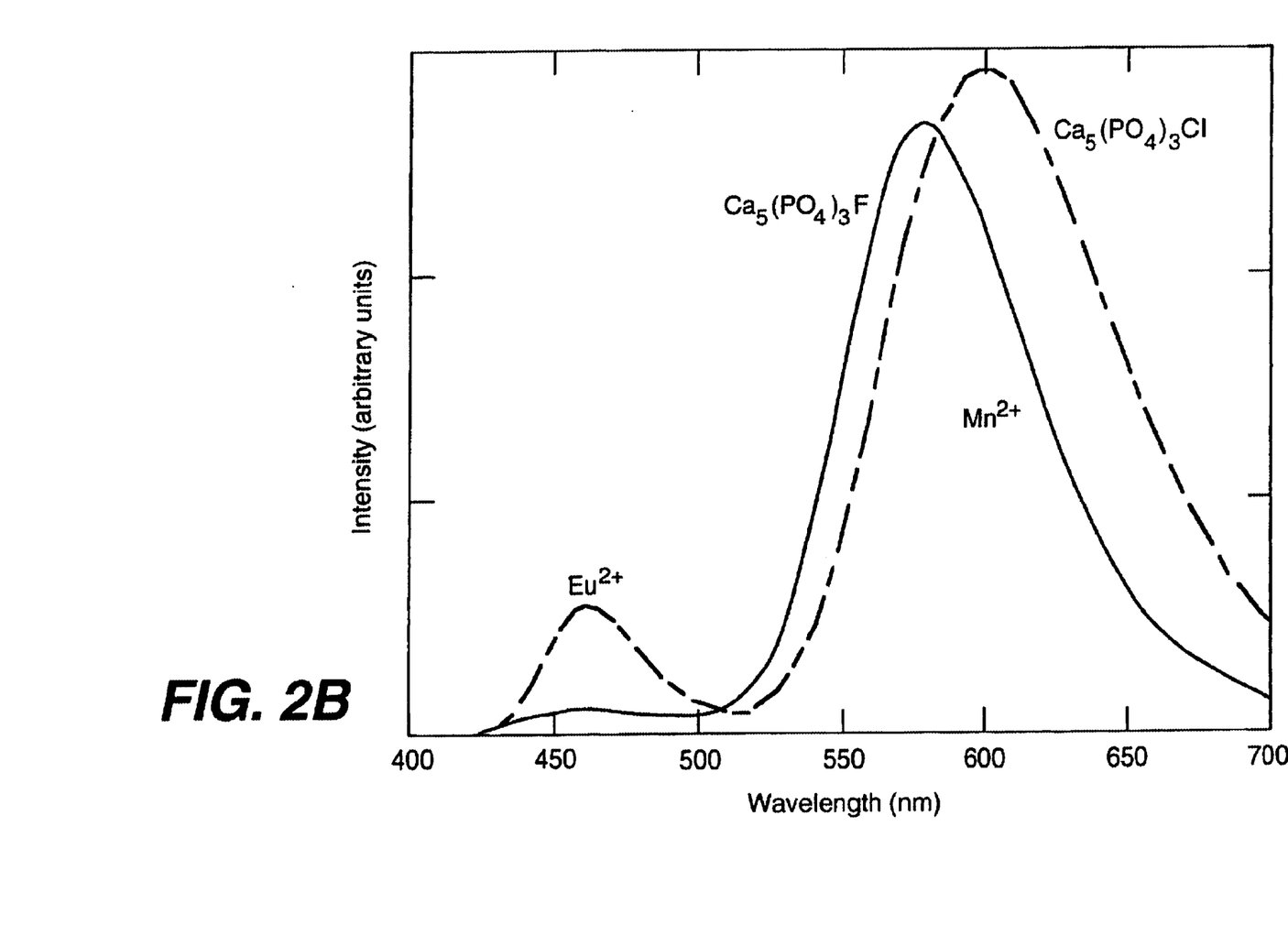
FIG. 2B shows the room-temperature emission spectra of the calcium halophosphate phosphors of FIG. 2A.
Figure 3A:
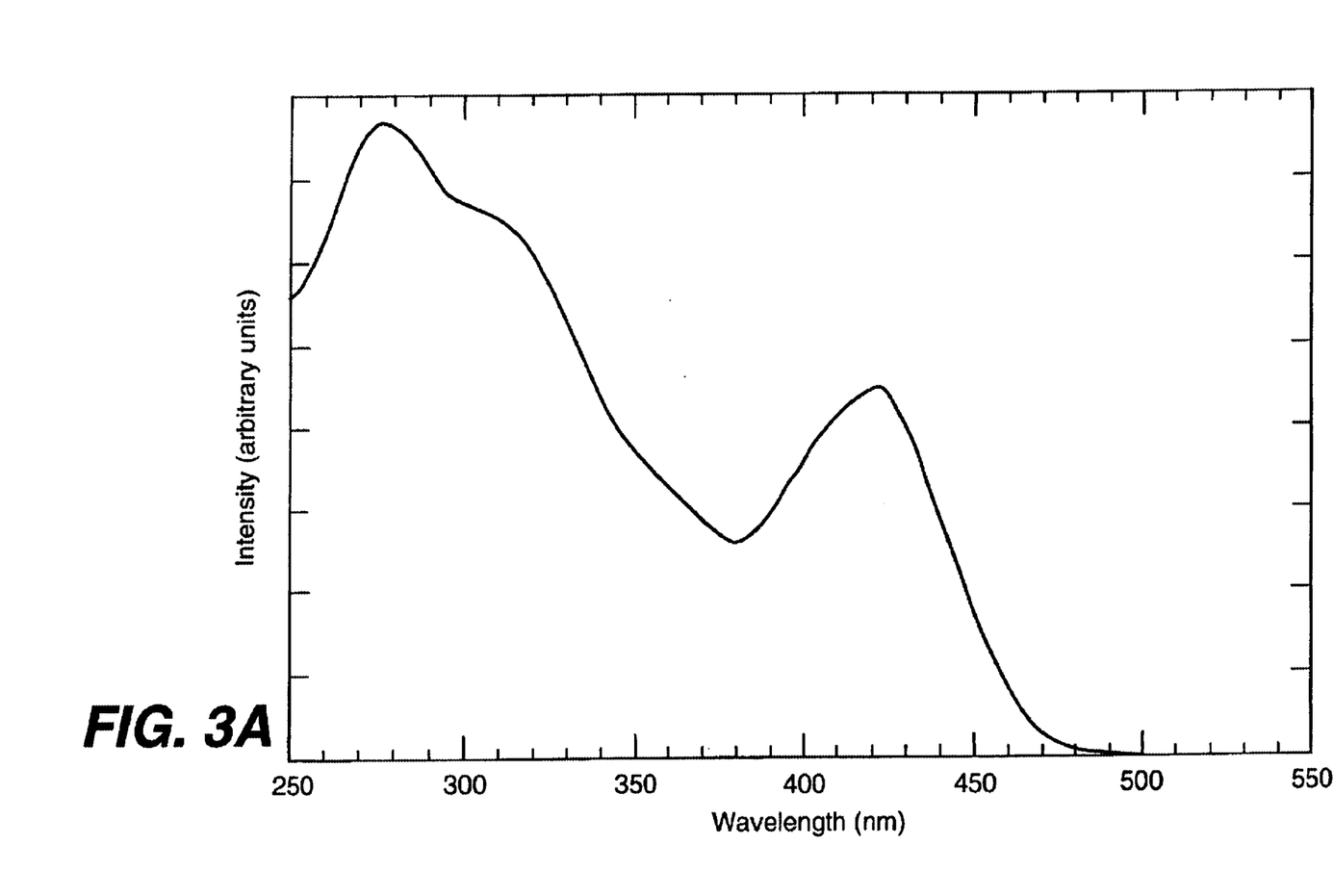
FIG. 3A shows the room-temperature excitation spectrum of the MFG phosphor.
Figure 3B:
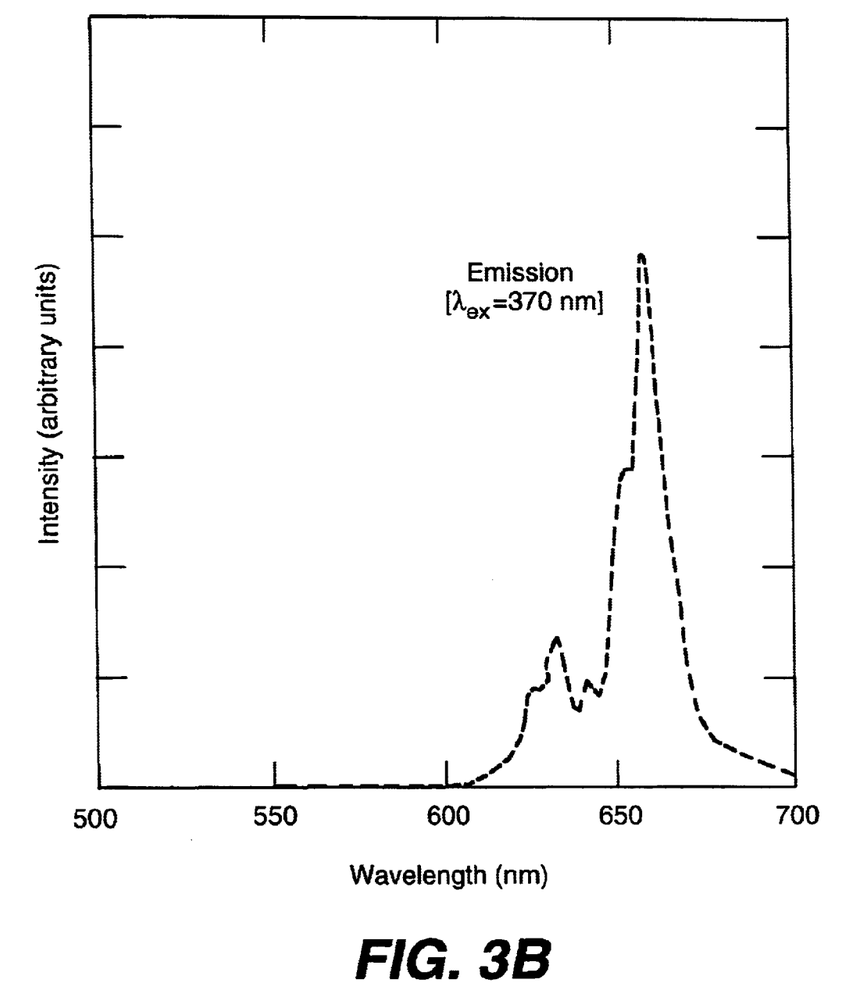
FIG. 3B shows the room-temperature emission spectrum of the MFG phosphor.
Figure 4:
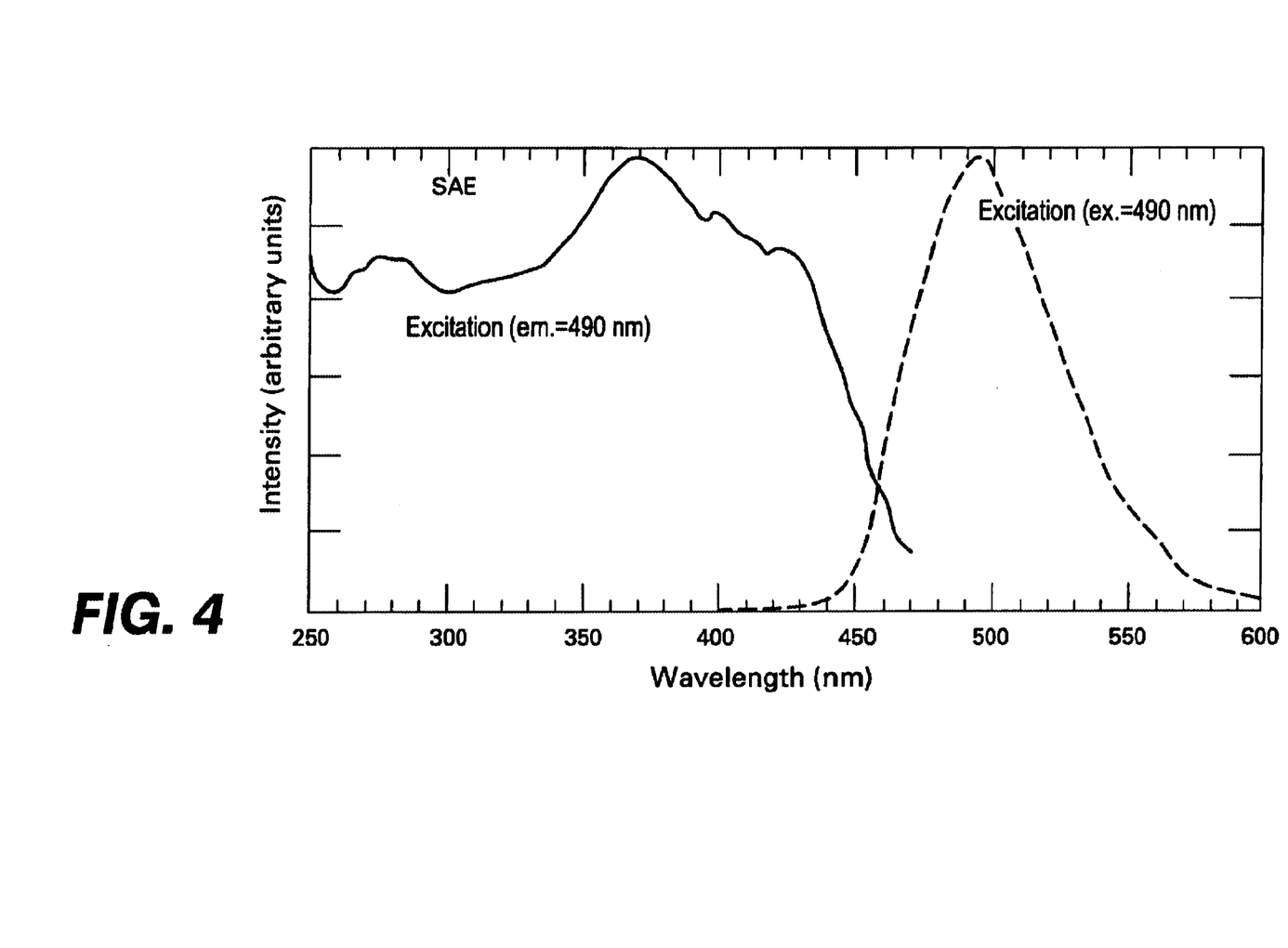
FIG. 4 shows the room-temperature excitation and emission spectra of the SAE phosphor.
Figure 5:
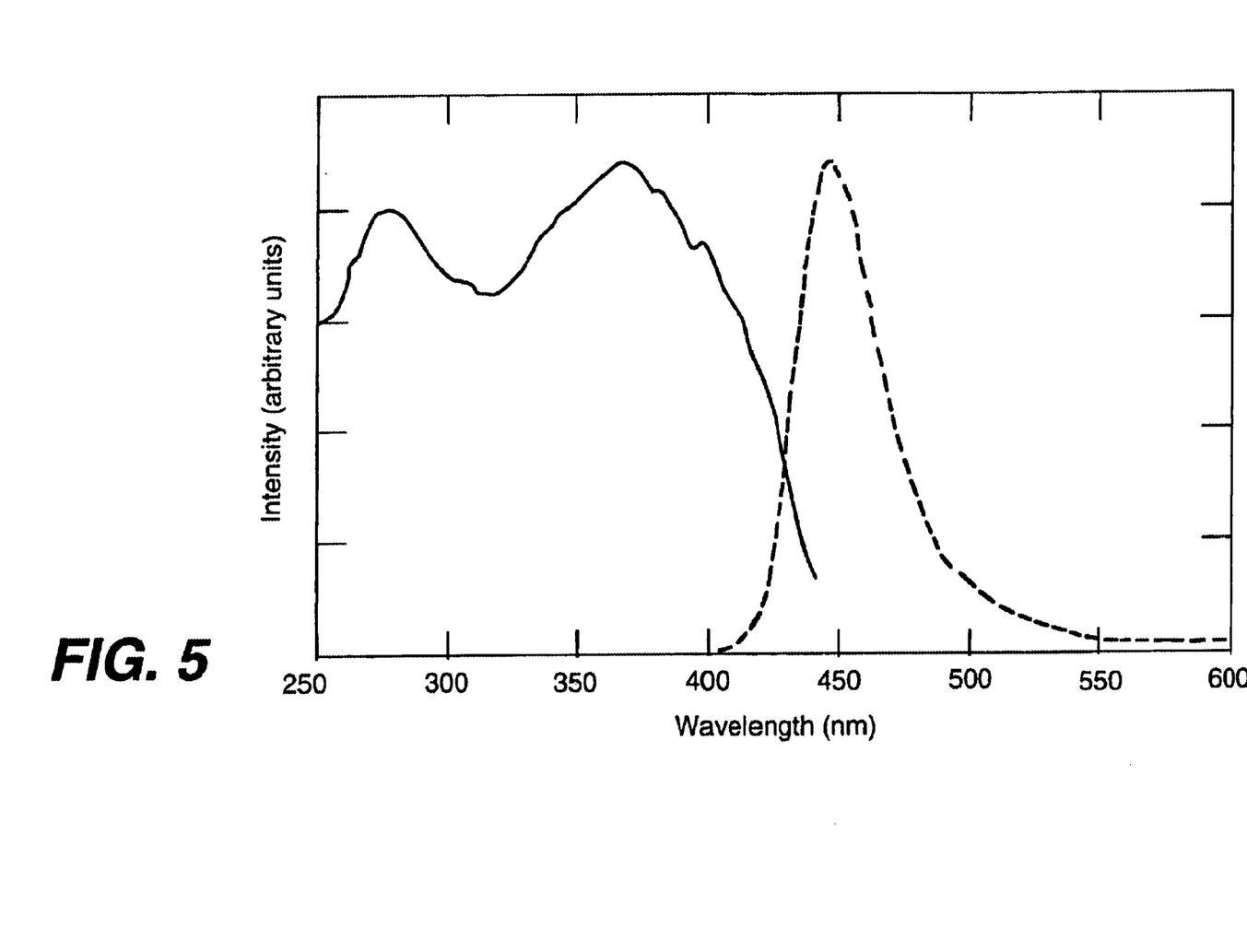
FIG. 5 shows the room-temperature excitation and emission spectra of the BAM phosphor.
Figure 6:
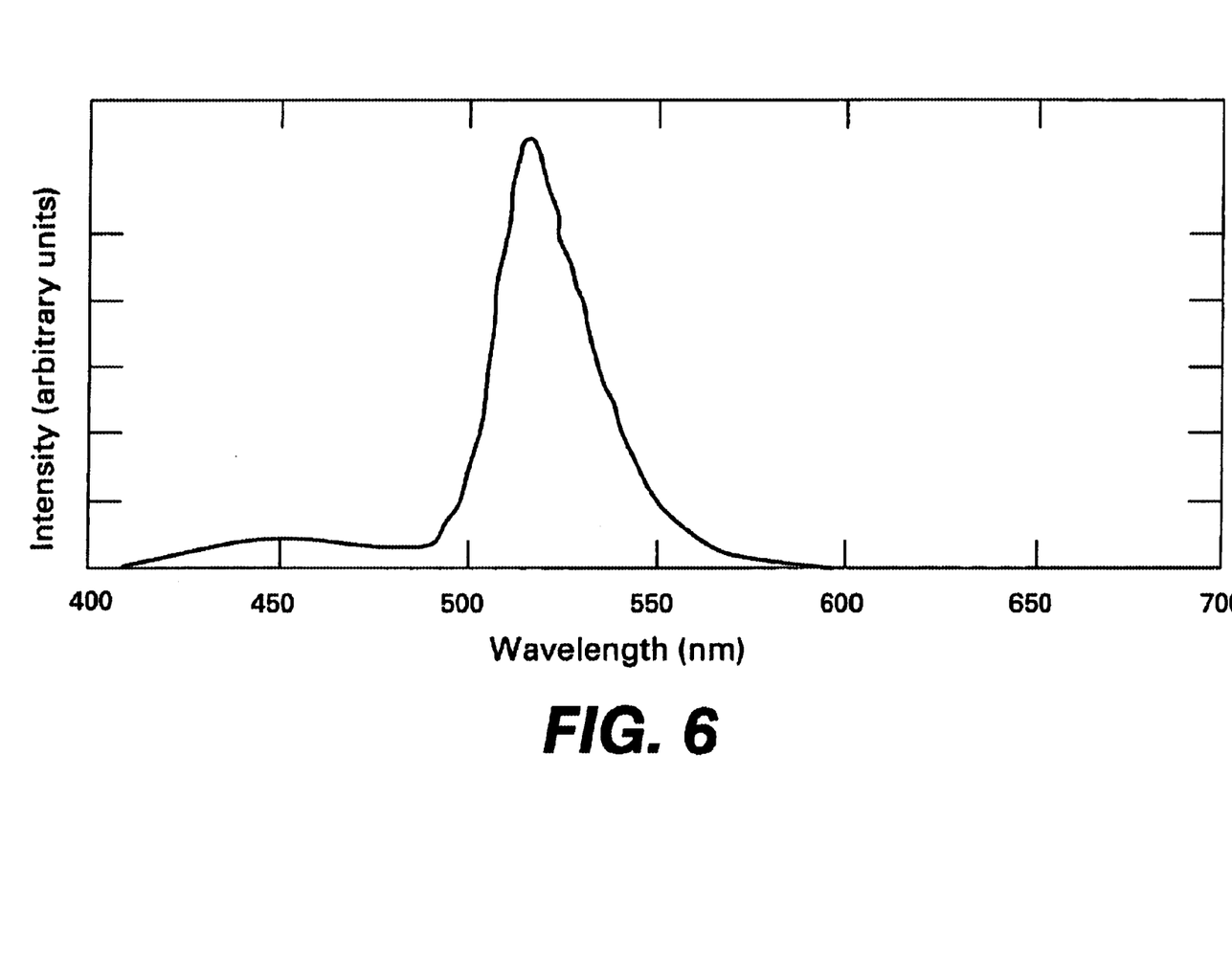
FIG. 6 shows the room-temperature emission spectrum of the BaMn phosphor. The room-temperature excitation spectrum of this phosphor is indistinguishable from that of the BAM phosphor.
Figure 7:
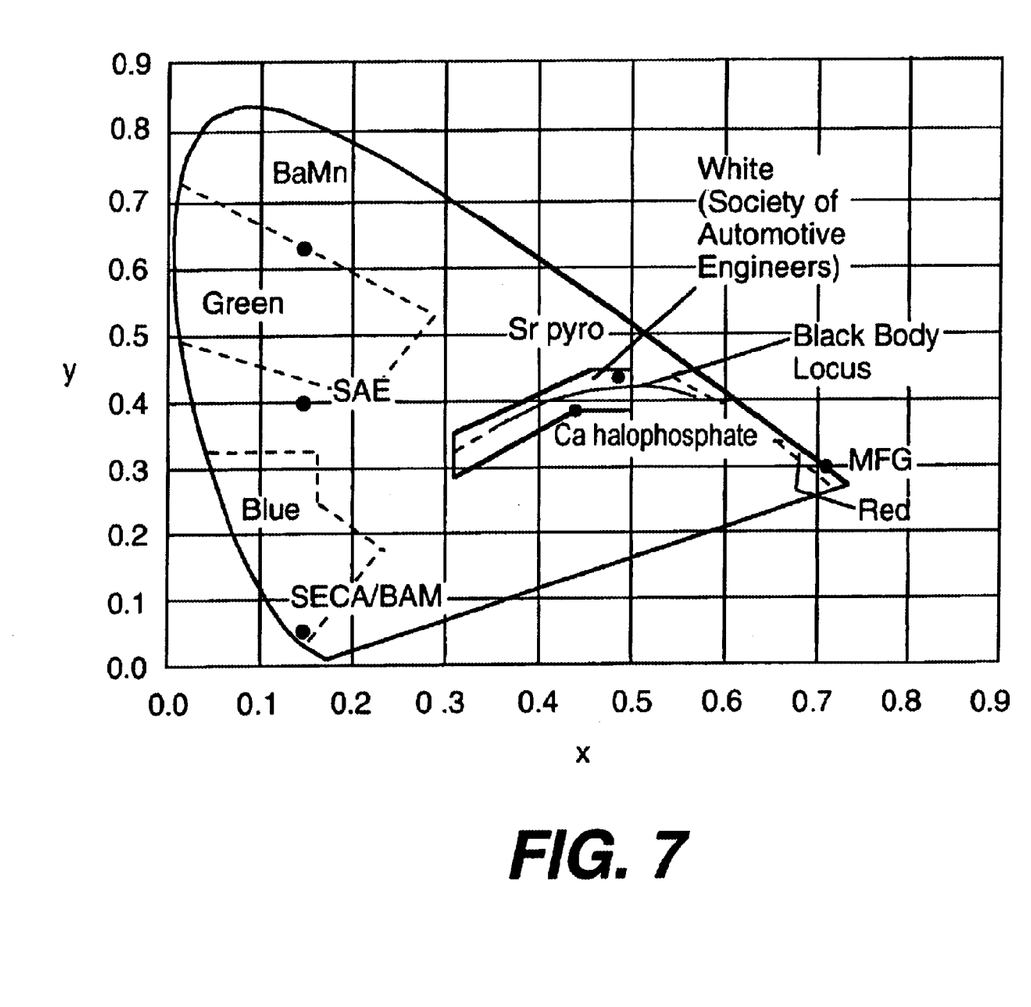
FIG. 7 shows the coordinates of the seven phosphors in the chromaticity diagram of the Commission Internationals de l'Eclairage ("CIE"). Blends of these phosphors may be produced to have coordinates close to the black body locus.

In addition to white light, light of other colors may be generated from other selected blends of the phosphors. FIG. 7 shows the coordinates of the phosphors in the CIE chromaticity diagram. A tie line between any two points representing two phosphors gives the set of color coordinates of the blends of these two phosphors. Similarly, an area inside a polygon, the vertices of which represent the coordinates of the individual phosphors, gives the set of possible colors given by blends of these phosphors.

The phosphors may be made by any conventional solid state reaction. For example, appropriate amounts of oxide and/or salts of the desired elements are mixed together thoroughly. The amounts are chosen so to achieve the final desired composition of the phosphor. The mixture is fired at an appropriate high temperature, such as greater than 900° C., to decompose the oxide or salts precursors to the desired compound. The firing may be done in an oxidizing or reducing atmosphere depending on the phosphor. The firing may done in stages at two or more temperature, each may be carried out in different atmosphere.

Alternatively, an acidic solution if oxides and/or salts of the desired elements are prepared by dissolving such oxides and/or salts in a mineral or organic acid. A solution of ammonium hydroxide or an amine is added slowly into the acidic solution to precipitate compounds of the chosen elements until the precipitation is complete. Typically, this step is complete when the pH of the mixture of the solutions rises above 8. The precipitate is filtered, washed, and dried in air. The dried precipitate is fired as described above.

White Light-Emitting Device

Incorporation of a selected blend of the phosphors in a device comprising a LED emitting near UV-to-blue light in the wavelength range from about 315 nm to about 480 nm should provide a white light source that uses electrical energy efficiently. The white light source may be fabricated to provide a point source device by using one near UV/blue LED or a large-area lighting device by using a plurality of near UV/blue LEDs.

Figure 8:
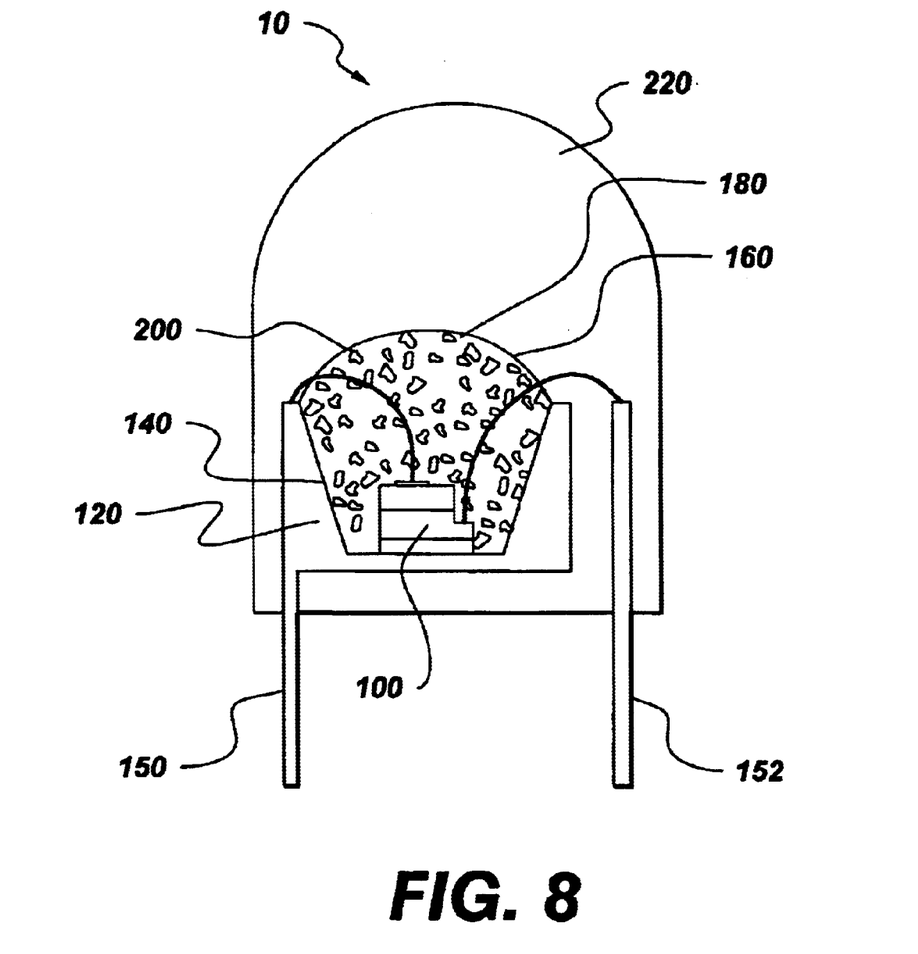
FIG. 8 shows an embodiment of a white-light source using a phosphor blend of the present invention.

In one embodiment of the present invention as shown in FIG. 8, a light source 10 comprises a LED 100 emitting near UV/blue light in the range of about 315 nm to about 480 nm, preferably from about 350 nm to about 420 nm, more preferably from about 350 nm to about 400 nm which is mounted in a cup 120 having a reflective surface 140 adjacent LED 100. Near UV/blue LEDs suitable for white light-emitting devices are GaN or In-doped GaN semiconductor-based LEDs such as those of U.S. Pat. No. 5,777,350 mentioned above, which is incorporated herein by reference. Other near UV/blue LEDs also may be used, such as LEDs based on GaN semiconductor doped with various metals to provide a large band gap. Electrical leads 150 and 152 are provided to supply electrical power to the LED. A transparent casting 160 comprising an epoxy or a silicone 180 in which there are dispersed substantially uniformly particles 200 of a phosphor blend of the present invention. Then a molded seal 220 of a transparent material, such as an epoxy or a silicone, is formed around the assembly of LED and phosphor casting to provide a hermetic seal thereto. Alternatively, the phosphor blend mixed with a binder may be applied as a coating over the LED surface, and a transparent casting is formed over the entire LED/phosphor combination to provide a hermetic seal. Other transparent polymers or materials also may be used. The composition of the InGaN active layer of the LED and the quantity of the phosphor applied in the casting may be chosen such that a portion of the blue light emitted by the LED that is not absorbed by the phosphor and the broad-spectrum light emitted by the phosphor are combined to provide a white light source 10 of a desired color temperature and CRI. Alternatively, when the light emitted by the active layer of the LED is deficient in the blue light range, the quantity of a blue light emitting-phosphor, such as SECA or BAM, may be increased to provide adequate blend for the different color components.

FIG. 7 shows that Ca halophosphate and Sr pyrophosphate phosphors would by themselves provide a white light very close to the black body locus and are substantially within the region of color coordinates defined as white light by the Society of Automotive Engineers. Other phosphor blends generating white light may be obtained from mixtures of BaMn/SAE/MFG or BaMn/SECA/BAM/MFG phosphors.

A large-area white light source of general illumination may by produced by disposing a plurality of blue LEDs on a flat reflective panel, providing appropriate electrical leads to the individual LEDs, applying coating comprising at least one phosphor blend of the present invention and a polymeric binder, such as an epoxy, and then sealing the whole combined structure in a transparent and hermetic seal. The phosphor blend/polymer coating may be applied directly on the individual LEDs or it may be applied over the entire panel surface. In the former case, an additional polymer coating may by applied over the entire panel surface after the phosphor has been applied on the LEDs. In addition, particles of an inert solid, such as $TiO_2$ or $Al_2O_3$, may be provided in the polymer matrix to enhance the uniformity of the light emission from the device.

While various embodiments are described herein, it will be appreciated from the specification that various combinations of elements, variations, equivalents, or improvements therein may be made by those skilled in the art, and are still within the scope of the invention as defined in the appended claims.

What is claimed is:

1. A phosphor blend comprising at least two phosphors selected from the group consisting of (a) $Sr_2P_2O_7:Eu^{2+}$, $Mn^{2+}$; (b) $(Ca,Sr,Ba)_a(PO_4)_3(F,Cl,OH):Eu^{2+},Mn^{2+}$ wherein a is in a range from about 4.5 to and including 5; (c) $3.5MgO.0.5MgF_2.GeO_2:Mn^{4+}$; (d) $(Sr,Ba,Ca)_5(PO_4)_3(Cl,OH):Eu^{2+}$; (e) an europium-activated aluminate phosphor selected from the group consisting of $(Ba,Ca,Sr)_2MgAl_{16}O_{27}:Eu^{2+}$, $(Ba,Ca,Sr)MgAl_{10}O_{17}:Eu^{2+}$, and $(Ba,Ca,Sr)Mg_3Al_{14}O_{25}:Eu^{2+}$; and (f) an europium and manganese co-activated aluminate phosphor selected from the group consisting of $(Ba,Ca,Sr)_2MgAl_{16}O_{27}:Eu^{2+},Mn^{2+}$, $(Ba,Ca,Sr)MgAl_{10}O_{17}:Eu^{2+},Mn^{2+}$, and $(Ba,Ca,Sr)Mg_3Al_{14}O_{25}:Eu^{2+},Mn^{2+}$; said phosphor blend being capable of absorbing electromagnetic radiation having wavelengths in a range from about 315 nm to about 480 nm and emitting light having wavelengths in the visible spectrum.

2. The phosphor blend of claim 1, wherein said phosphor blend absorbs electromagnetic radiation substantially in a wavelength range from about 350 nm to about 410 nm.

3. The phosphor blend of claim 1, wherein a is in a range from about 4.7 to and including 5.

4. The phosphor blend of claim 1, wherein said emitted light is white light.

5. The phosphor blend of claim 4, wherein said white light has color coordinates substantially on a black body locus of a CIE chromaticity diagram.

6. The phosphor blend of claim 5, wherein a is in a range from about 4.7 to and including 5.

7. The phosphor blend of claim 1, wherein a is in a range from about 4.9 to and including 5.

8. The phosphor blend of claim 5, wherein a is in a range from about 4.9 to and including 5.

9. A phosphor blend comprising a mixture of $(Ca,Sr,Ba)_a(PO_4)_3(F,Cl,OH):Eu^{2+},Mn^{2+}$ wherein a is in a range from about 4.5 to and including 5 and at least one phosphor that is selected from the group consisting of (a) $Sr_2P_2O_7:Eu^{2+}$, $Mn^{2+}$; (b) $3.5MgO.0.5MgF_2.GeO_2:Mn^{4+}$; (c) $Sr_4Al_{14}O_{25}:Eu^{2+}$; (d) $(Sr,Ba,Ca)_5(PO_4)_3(Cl,OH):Eu^{2+}$; (e) an europium activated aluminate phosphor selected from the group consisting of $(Ba,Ca,Sr)_2MgAl_{16}O_{27}:Eu^{2+}$, $(Ba,Ca,Sr)MgAl_{10}O_{17}:Eu^{2+}$, and $(Ba,Ca,Sr)Mg_3Al_{14}O_{25}:Eu^{2+}$; and (f) an europium and manganese co-activated aluminate phosphor selected from the group consisting of $(Ba,Ca,Sr)_2MgAl_{16}O_{27}:Eu^{2+},Mn^{2+}$, $(Ba,Ca,Sr)MgAl_{10}O_{17}:Eu^{2+},Mn^{2+}$, and $(Ba,Ca,Sr)Mg_3Al_{14}O_{25}:Eu^{2+},Mn^{2+}$; said phosphor blend being capable of absorbing electromagnetic radiation having wavelengths in a range from about 315 nm to about 480 nm and emitting light having wavelengths in the visible spectrum.

10. The phosphor blend of claim 9, wherein said phosphor blend absorbs electromagnetic radiation substantially in a wavelength range from about 350 nm to about 410 nm.

11. The phosphor blend of claim 9, wherein a is in a range from about 4.7 to and including 5.

12. The phosphor blend of claim 9, wherein a is in a range from about 4.9 to and including 5.

13. A phosphor blend comprising a mixture of $Sr_2P_2O_7:Eu^{2+},Mn^{2+}$ and at least one phosphor that is selected from the group consisting of (a) $(Ca,Sr,Ba)_a(PO_4)_3(F,Cl,OH):Eu^{2+},Mn^{2+}$ wherein a is in a range from about 4.5 to and including 5; (b) $3.5MgO.0.5MgF_2.GeO_2:Mn^{4+}$; (c) $(Sr,Ba,Ca)_5(PO_4)_3(Cl,OH):Eu^{2+}$; (d) an europium activated aluminate phosphor selected from the group consisting of $(Ba,Ca,Sr)_2MgAl_{16}O_{27}:Eu^{2+}$, $(Ba,Ca,Sr)MgAl_{10}O_{17}:Eu^{2+}$, and $(Ba,Ca,Sr)Mg_3Al_{14}O_{25}:Eu^{2+}$; (e) an europium and manganese co-activated aluminate phosphor selected from the group consisting of $(Ba,Ca,Sr)_2MgAl_{16}O_{27}:Eu^{2+},Mn^{2+}$, $(Ba,Ca,Sr)MgAl_{10}O_{17}:Eu^{2+},Mn^{2+}$, and $(Ba,Ca,Sr)Mg_3Al_{14}O_{25}:Eu^{2+},Mn^{2+}$; said phosphor blend being capable of absorbing electromagnetic radiation having wavelengths in a range from about 315 nm to about 480 nm and emitting light having wavelengths in the visible spectrum.

14. The phosphor blend of claim 13, wherein said phosphor blend absorbs electromagnetic radiation substantially in a wavelength range from about 350 nm to about 410 nm.

15. A phosphor blend comprising a mixture of $Sr_2P_2O_7:Eu^{2+},Mn^{2+}$ and $(Ca,Sr,Ba)_a(PO_4)_3(F,Cl,OH):Eu^{2+},Mn^{2+}$; wherein a is in a range from about 4.5 to and including 5, and said phosphor blend being capable of absorbing electromagnetic radiation having wavelengths in a range from about 315 nm to about 480 nm and emitting light having wavelengths in the visible spectrum.

16. The phosphor blend of claim 15, wherein said phosphor blend absorbs electromagnetic radiation substantially in a wavelength range from about 350 nm to about 410 nm.

17. The phosphor blend of claim 15, wherein a is in a range from about 4.7 to and including 5.

18. The phosphor blend of claim 15, wherein a is in a range from about 4.9 to and including 5.

19. A phosphor blend comprising a mixture of phosphors having formulas $3.5MgO.0.5MgF_2.GeO_2:Mn^{4+}$; $Sr_4Al_{14}O_{25}:Eu^{2+}$; and an europium and manganese co-invented aluminate phosphors selected from the group consisting of $(Ba,Ca,Sr)_2MgAl_{16}O_{27}:Eu^{2+},Mn^{2+}$, $(Ba,Ca,Sr)MgAl_{10}O_{17}:Eu^{2+},Mn^{2+}$, $(Ba,Ca,Sr)Mg_3Al_{14}O_{25}:Eu^{2+},Mn^{2+}$; said phosphor blend being capable of absorbing electromagnetic radiation having wavelengths in a range from about 315 nm to about 480 nm and emitting light having wavelengths in the visible spectrum.

20. The phosphor blend of claim 19 wherein said phosphor blend absorbs electromagnetic radiation substantially in a wavelength range from about 350 nm to about 410 nm.

21. A light source comprising: at least one LED that is capable of emitting electromagnetic radiation having wavelengths in a range from near UV to blue; least one phosphor material selected from the group consisting of (a) $(Ca,Sr,Ba)_a(PO_4)_3(F,Cl,OH):Eu^{2+},Mn^{2+}$ wherein a is in a range from about 4.5 to and including 5; (b) $3.5MgO.0.5MgF_2.GeO_2:Mn^{4+}$; (c) $(Sr,Ba,Ca)_5(PO_4)_3(Cl,OH):Eu^{2+}$; (d) an europium-activated aluminate phosphor selected from the group consisting of $(Ba,Ca,Sr)_2MgAl_{16}O_{27}:Eu^{2+}$, $(Ba,Ca,Sr)MgAl_{10}O_{17}:Eu^{2+}$, and $(Ba,Ca,Sr)Mg_3Al_{14}O_{25}:Eu^{2+}$; and (e) an europium and manganese co-activated aluminate phosphor selected from the group consisting of $(Ba,Ca,Sr)_2MgAl_{16}O_{27}:Eu^{2+},Mn^{2+}$, and $(Ba,Ca,Sr)Mg_3Al_{14}O_{25}:Eu^{2+},Mn^{2+}$; and (f) mixtures thereof; said phosphor material being capable of absorbing said electromagnetic radiation emitted by said LED and emitting light having wavelengths in the visible spectrum.

22. The light source of claim 21, wherein said LED emits electromagnetic radiation in a wavelength from about 315 nm to about 480 nm.

23. The light source of claim 21, wherein a is from about 4.7 to and including 5.

24. The light source of claim 21, wherein said LED preferably emits electromagnetic radiation from about 350 nm to about 410 nm.

25. The light source of claim 21, wherein a is from about 4.9 to and including 5.

26. A light source comprising: at least one LED that is capable of emitting electromagnetic radiation having wavelengths in a range from near UV to blue; and a phosphor consisting of a material selected from the group consisting of $Sr_2P_2O_7:Eu^{2+},Mn^{2+}$, $(Ca,Sr,Ba)_a(PO_4)_3(F,Cl,OH)Eu^{2+},Mn^{2+}$ wherein a is in a range from about 4.5 to and including 5, and mixtures thereof; said phosphor being capable of absorbing said electromagnetic radiation emitted by said LED and emitting light having wavelengths in the visible spectrum.

27. The light source of claim 26, wherein a is from about 4.7 to and including 5.

28. The light source of claim 26 wherein a is from about 4.9 to and including 5.

29. A light source comprising: at least one LED that is capable of emitting electromagnetic radiation having wavelengths in a range from near UV to blue; and a phosphor consisting of a first material selected from the group consisting of $Sr_2P_2O_7:Eu^{2+},Mn^{2+}$ and $(Ca,Sr,Ba)_a(PO_4)_3(F,Cl,OH)Eu^{2+},Mn^{2+}$ wherein a is in a range from about 4.5 to and including 5; and a second, material selected from the group consisting of (a) $3.5MgO0.5MgF_2GeO_2:Mn^{4+}$; an europium-activated aluminate phosphor selected from the group consisting of $(Ba,Ca,Sr)_2MgAl_{16}O_{27}:Eu^{2+},Mn^{2+}$, $(Ba,Ca,Sr)MgAl_{10}O_{17}:Eu^{2+},Mn^{2+}$, and $(Ba,Ca,Sr)Mg_3Al_{14}O_{25}:Eu^{2+},Mn^{2+}$; and (c) an europium and manganese co-activated aluminate phosphor selected from the group consisting of $(Ba,Ca,Sr)_2MgAl_{16}O_{27}:Eu^{2+},Mn^{2+}$, $(Ba,Ca,Sr)MgAl_{10}O_{17}:Eu^{2+},Mn^{2+}$, and $(Ba,Ca,Sr)Mg_3Al_{14}O_{25}:Eu^{2+},Mn^{2+}$.

30. A phosphor blend comprising a mixture of phosphors having a formula of $3.5MgO.0.5MgF_2.GeO_2:Mn^{4+}$; $(Sr,Ba,Ca)_5(PO_4)_3(Cl,OH):Eu^{2+}$; and an europium activated aluminate phosphor selected from the group consisting of $(Ba,Ca,Sr)_2MgAl_{16}O_{27}:Eu^{2+}$, $(Ba,Ca,Sr)MgAl_{10}O_{17}:Eu^{2+}$, $Mn^{2+}$, and $(Ba,Ca,Sr)Mg_3Al_{14}O_{25}:Eu^{2+},Mn^{2+}$; said phosphor blend being capable of absorbing electromagnetic radiation having wavelengths in a range from about 315 nm to about 480 nm and emitting light having wavelengths in the visible spectrum.

31. The phosphor blend of claim 30, wherein said phosphor blend absorbs electromagnetic radiation substantially in a wavelength range from about 350 nm to about 410 nm.

* * * * *

(12) EX PARTE REEXAMINATION CERTIFICATE (8595th)
United States Patent
Setlur et al.

(10) Number: US 6,685,852 C1
(45) Certificate Issued: Oct. 4, 2011

(54) PHOSPHOR BLENDS FOR GENERATING WHITE LIGHT FROM NEAR-UV/BLUE LIGHT-EMITTING DEVICES

(75) Inventors: Anant Achyut Setlur, Niskayuna, NY (US); Alok Mani Srivastava, Niskayuna, NY (US); Holly Ann Comanzo, Niskayuna, NY (US); Daniel Darcy Doxsee, Sagamore Hills, OH (US)

(73) Assignee: General Electric Company, Schenectady, NY (US)

Reexamination Request:
No. 90/011,313, Nov. 2, 2010

Reexamination Certificate for:
Patent No.: 6,685,852
Issued: Feb. 3, 2004
Appl. No.: 09/681,549
Filed: Apr. 27, 2001

(51) Int. Cl.
*C09K 11/08* (2006.01)
*C09K 11/66* (2006.01)
*C09K 11/77* (2006.01)
*H01L 33/00* (2006.01)

(52) U.S. Cl. ............. 252/301.4 R; 252/301.4 P; 257/98; 313/503

(58) Field of Classification Search ............ 252/301.4 R
See application file for complete search history.

(56) References Cited

U.S. PATENT DOCUMENTS 6,621,211 B1    9/2003 Srivastava et al.

FOREIGN PATENT DOCUMENTS

| JP | 61-135043 | 6/1986 |
| JP | 09-007545 | 1/1997 |
| JP | 10-190053 | 7/1998 |
| JP | 2000-21353 | 1/2000 |
| JP | 2000-73052 | 3/2000 |

OTHER PUBLICATIONS

Visible and Ultraviolet Spectroscopy, http://www2.chemistry.msu.edu/faculty/reusch/VirtTxtJml/Spectrpy/UV–Vis/spectrum.htm, Feb. 28, 2011.

*Primary Examiner* — Alan Diamond (57) ABSTRACT

Phosphor blends are disclosed that are capable of absorbing electromagnetic radiation having wavelengths in the range from about 315 nm to about 480 nm. These blends are mixtures of phosphors selected from the group consisting of $Sr_2P_2O_7:Eu^{2+}, Mn^{2+}$, $(Ca,Sr,Ba)_5(PO_4)_3(F,Cl,OH):Eu^{2+}, Mn^{2+}$, $3.5\ MgO\cdot0.5MgF_2\cdot GeO_2:Mn^{4+}$, $Sr_4Al_{14}O_{25}:Eu^{2+}$, $(Sr,Ba,Ca)_5(PO_4)_3(Cl,OH):Eu^{2+}$, $(Ba,Ca,Sr)_2MgAl_{16}O_{27}:Eu^{2+}$, and $(Ba,Ca,Sr)_2MgAl_{16}O_{27}:Eu^{2+},Mn^{2+}$. White light sources are obtained by applying a phosphor blend over at least one LED that is capable of emitting electromagnetic radiation in the above-noted wavelength range.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9-12, 15-18 and 26-29 is confirmed.

Claims 1-8, 13, 14, 19-25, 30 and 31 are cancelled.

New claims 32-35 are added and determined to be patentable.

*32. A phosphor blend comprising (a) $3.5MgO.0.5MgF_2.GeO_2:Mn^{4+}$; (b) $(Sr,Ba,Ca)_5(PO_4)_3(Cl,OH):Eu^{2+}$; and (c) $Sr_4Al_{14}O_{25}:Eu^{2+}$, said phosphor blend being capable of absorbing electromagnetic radiation having wavelengths in a range from about 315 nm to about 480 nm and emitting light having wavelengths in the visible spectrum.*

*33. The phosphor blend of claim 32, wherein said phosphor blend further includes a yellow phosphor absorbing electromagnetic radiation substantially in a wavelength range from about 350 nm to about 410 nm.*

*34. The phosphor blend of claim 33, wherein said yellow phosphor emits light a peak wavelength range of about 570 nm to about 605 nm.*

*35. The phosphor blend of claim 32, wherein said emitted light is white light.*

\* \* \* \* \*